United States Patent [19]
Ross et al.
[11] Patent Number: 4,563,236
[45] Date of Patent: Jan. 7, 1986

[54] METHOD FOR MAKING LARGE AREA STABLE DOMAINS

[75] Inventors: William E. Ross, Woodland Hills; George R. Pulliam, Anaheim, both of Calif.

[73] Assignee: Litton Systems, Inc., Beverly Hills, Calif.

[21] Appl. No.: 321,149

[22] Filed: Nov. 13, 1981

[51] Int. Cl.[4] .......................... C30B 1/00; C30B 29/28

[52] U.S. Cl. .................................... 156/601; 156/603; 156/DIG. 111; 252/62.56; 252/62.57; 423/594; 423/593

[58] Field of Search ............. 156/601, 603, DIG. 111, 156/DIG. 63, DIG. 74, 654; 428/611; 252/62.51, 62.56, 62.57; 365/33, 34; 423/593, 594

[56] References Cited

PUBLICATIONS

Physics Review, v. 79, 1946, p. 965, Kittel.

Jl. of Applied Physics, v. 77, No. 8, 8/76, Krumme et al.

*Primary Examiner*—Hiram H. Bernstein

[57] ABSTRACT

A method for producing a large area of single domain magnetic bistability is shown including the steps of selecting the properties of films of magnetic materials such that the saturation field ($H_s$) that is less than the value of the anisotropy field ($H_k$) reduced by the value of a demagnetization factor ($4\pi$) times the magnetization value ($M_s$) as stated in the equation:

$$H_s < H_k - 4\pi M_s.$$

Isolated areas are created in these films by means which do not introduce changes in the magnetic properties, such as stress anisotropy effects. Large area stable domains exist in material whose measured magnetic properties meet this relationship independent of temperature and without a requirement for a magnetic bias.

10 Claims, 3 Drawing Figures

STABLE CONDITION

MAGNETIZATION (M) VS MAGNETIC FIELD (H) CURVES
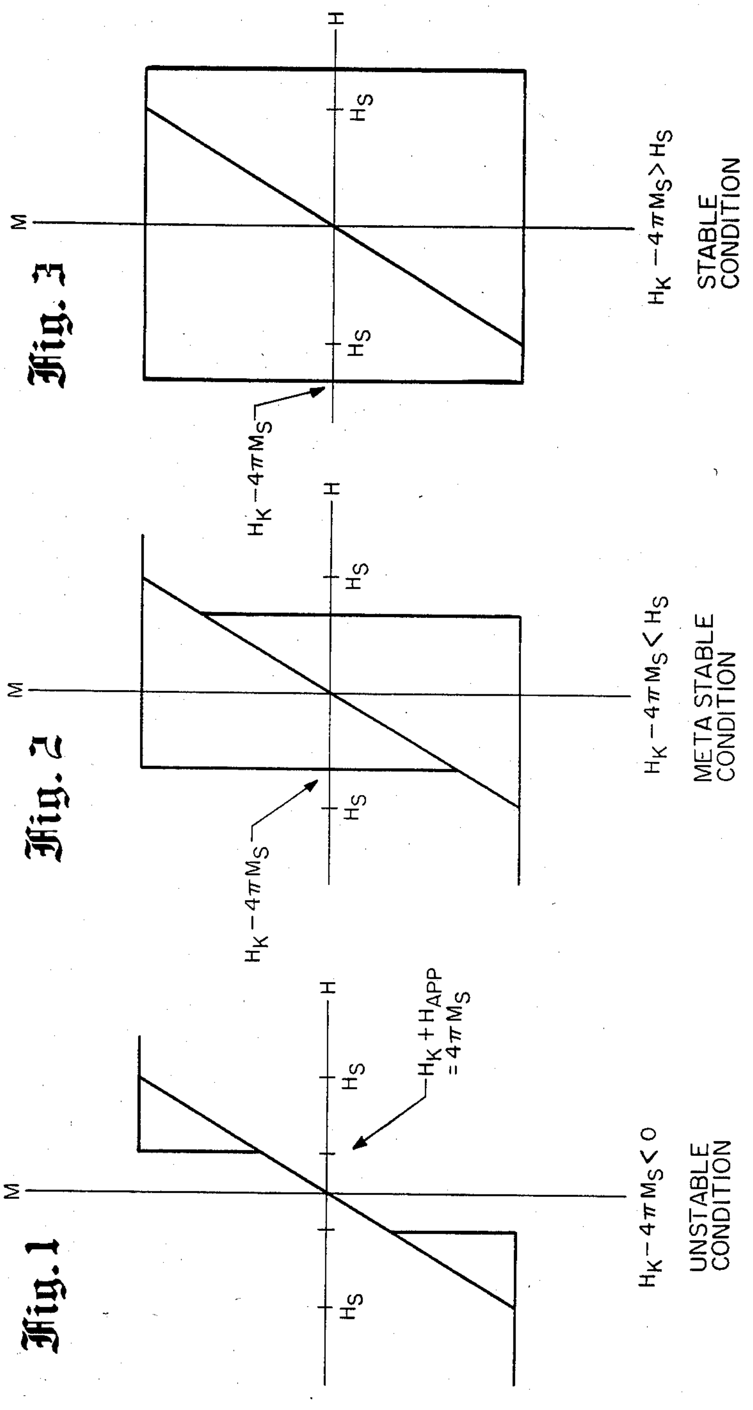

METHOD FOR MAKING LARGE AREA STABLE DOMAINS

The present invention relates to a method or process for producing stable large area magnetic domains in magnetic films and to a product created by that process. More particularly, the present invention relates to a method for selecting films of magnetic materials with appropriate magnetic characteristics which will yield a large area single domain that is magnetically bistable in the absence of a biasing magnetic field.

BACKGROUND OF THE INVENTION

It is well known in the prior art that a magnetic material will stabilize with a plurality of equally sized magnetic domains, half magnetized in one direction and the other half magnetized in an opposite direction, since this produces a minimum energy state in the absence of externally applied fields. The size of each domain is referred to as equilibrium energy domain size which is generally measured in microns. The equilibrium energy domain size is established by several energy factors including anisotropy energy, magnetostatic energy and domain wall energy. A more complete explanation of the phenomenon may be found in an article by C. Kittel, entitled The Theory of The Structure of Ferromamagnetic Domains in films & Small Particles which appeared in *Physics Review,* Vol. 79, 1946, page 965.

The concept of utilizing magnetic domains and polarized light to create a magneto-optic iron-garnet display has been taught in an article by B. Hill and K. P. Schmidt entitled "Fast Switchable Magneto-Optic Memory-Display Components" which appeared in the *Philips Journal of Research,* Vol. 33, Nos. 5/6, 1978, page 211.

The display device taught in the Philips' article describes how the occurance of domains in a magneto-optic iron-garnet wafer is temperature dependent. That is, at a certain temperature the sublattice magnetizations cancel each other with the result that the net magnetization of the film vanishes. At this temperature point it is not possible to change the domains since there is no net magnetization to act on.

Yet another article by J. P. Krumme, P. Hansen, and K. Witter entitled "Thermomagnetic Switching of Ferrimagnetic Garnet Films At Their Compensation Temperature" which appeared in the *Journal of Applied Physics,* Vol. 47, No. 8, August 1976, page 3681 describes the creation of domains within a group of materials which is temperature dependent.

While the creation of domains within many materials has been discussed in the literature, few materials have been discussed which lend themselves to the creation of large area single domains. In many devices, such as a display device, it is desirable to obtain a large area capable of supporting a single domain within that area which may be switched from one direction of magnetization to another but which remains stable in either direction. This bistability is essential. The material must be uniaxial. i.e., magnetizable only along a single easy axis. Further, the material should not require a biasing magnetic field to retain bistability nor should the stability be temperature dependent.

SUMMARY OF THE INVENTION

Accordingly, it is the object of the present invention to select a magnetic material that exhibits a large area stable magnetic domain within the material without the use of a biasing magnetic field.

It is another object of the present invention to select a magnetic material that exhibits a large area stable magnetic domain within the material where the stability of the material is independent of temperature.

A further object of the present invention is to select a magnetic material capable of single domain magnetic bistability over a large area which is not influenced by magnetic anomalies at the edge of the area.

In obtaining these and other objects, the method taught by the present invention is accomplished by establishing the magnetic properties of the magnetic material including the anisotropy field, the saturation field and the magnetization value of the material everywhere within the large area which is to be made a single magnetic domain. If the value of the saturation field is established to be less than the value of the factored anisotropy field reduced by the value of a demagnetizing field, then a large area stable domain may be formed in the material independent of the equilibrium energy domain size.

DESCRIPTION OF THE DRAWINGS

A more thorough understanding of the present invention will be had after careful consideration of the following specification and drawings, wherein:

FIG. 1 is a magnetization curve showing magnetization (M) versus magnetic field (H) for an unstable condition;

FIG. 2 shows a magnetization curve of magnetization (M) versus magnetic field (H) for a metastable condition; and FIG. 3 shows a magnetization curve of magnetization (M) versus magnetic field (H) for a stable condition.

DESCRIPTION OF THE PREFERRED EMBODIMENTS

In the preferred embodiment of the present invention, it has been discovered that proper selection of certain measured characteristics, such as magnetic field strengths, will permit the growth and/or selection of a magnetic material which is capable of retaining a large area stable domain in a single, predetermined direction of magnetization.

In the preferred embodiment, a large area stable domain is formed in a magnetic material that includes single crystal magnetic epitaxial garnet material grown on a non-magnetic single crystal garnet substrate. It will be understood that the single crystal garnet materials may be either synthetically grown upon the substrate or may occur in nature including other materials such as spinels, hexagonal ferrites, or metals. Further, spinels, hexagonal ferrites or metals may be used in place of the single crystal materials provided these materials are capable of meeting the requirements of the method described herein. While the preferred embodiment describes the use of a single crystal magnetic material for use in a magneto-optic display device, it will be understood that large area single domain materials have application in a wide range of devices including magneto-optic devices, computer memory elements, logic devices, microwave filter devices, microwave magnetostatic devices, and systems requiring magnetic elements in a nonvolatile bistable state.

In a magnetic-optic display device, the single crystal magnetic film placed upon the non-magnetic single crystal substrate is patterned into isolated areas by the removal of the magnetic material from the substrate to form the magnetic material into islands.

To understand the measurements required, the following properties are of interest:

| PROPERTY | SYMBOL | UNITS |
|---|---|---|
| Saturation Field of Virgin Sample | $H_s$ | Oersted |
| Magnetization | $M_s$ | Gauss |
| Demagnetization Factor | $4\pi$ | No Units |
| Anisotropy Constant | $K_u$ | ergs/cm$^3$ |
| Demagnetization Field | $H_d$ | Oersted |
| Applied Magnetic Field | $H_{app}$ | Oersted |
| and the derived property: | | |
| Anisotropy Field | $H_k = 2K_u/M_s$ | Oersted |

The measurement of these properties may be accomplished by several methods. For the purposes of this invention, the determinative properties to be measured are the initial saturation field ($H_s$), the anisotropy field ($H_k$) and the magnetization value ($M_s$).

The saturation field ($H_s$) may be measured by observing the many strip like domains within an epitaxial magnetic film by passing polarized light through the film and observing that light through an analyzer. The Faraday effect of the domains within the epitaxial film causes the polarized light to be rotated in a clockwise or counterclockwise direction depending upon the direction of magnetization of each individual stripe. As the light passes through the analyzer, the strips appear as light or dark stripes depending upon the direction of magnetization of that stripe. By exposing the film to a magnetic field and then increasing the field, the set of magnetic domains aligned to the applied field will grow, while those opposed to the field will shrink. At the field strength where the last reversed domain is eliminated the saturation field is established.

The magnetization value ($M_s$) which, when multiplied by the demagnetization factor ($4\pi$) is referred to as the demagnetization field, is a characteristic of the magnetic material and may be measured by one of several methods.

The basic method for establishing the value $M_s$ measures the voltage from a pick-up coil surrounding the magnetic material as it is caused to reverse its direction of magnetization. The reversal of magnetization results in a change in magnetic flux which induces a voltage in the pick-up coil. Standard texts on magnetism describe how the induced voltage can be related to the magnetization value ($M_s$) of the material, see *Ferromagnetism*, R. M. Bozorth, page 842, D. Van Nostrand Company, New York, 1951.

S. Chikazumi, *Physics of Magnetism*, John Wiley and Sons, New York, 1964, page 130 describes an automatic torque magnetometer technique for measuring the anisotropy constant ($K_u$) of magnetic materials. With $M_s$ and $K_u$ known, the anisotropy field $H_k$ is calculated from the ration $2K_u/M_s$. R. M. Josephs, "Characterization of the Magnetic Behavior of Bubble Domains", *AIP Conference Proceedings*, Nov. 10, 1973, page 286, covers a general approach to measuring the magnetic properties of epitaxial garnet materials.

After measurements of the saturation field ($H_s$), magnetization value ($M_s$) and anisotropy field ($H_k$) have been completed, the material selected should have a value of initial saturation field ($H_s$) less than the value of the anisotropy field ($H_k$) reduced by the value of the demagnetization factor ($4\pi$) times the magnetization value ($M_s$). This equation may be expressed:

$$H_k - 4\pi M_s > H_2.$$

If this condition is met, an isolated large area stable domain can exist only in the saturated state once the saturation field ($H_s$) has been exceeded.

In the past it was felt that large domains were obtained by using magnetic materials with low magnetization. This is not necessary in this invention.

Low magnetization materials are not the preferred way to create large area stable domains. Using the properly selected range of magnetic material properties taught by this invention, large stable domains are possible independent of the equilibrium domain size. Large domains can be maintained in a stable state whose dimensions far exceed the dimensions of the equilibrium energy domain size. The ratio of stable domain width to equilibrium energy domain width can exceed 1000 times.

It is important that one can create isolated magnetic regions in epitaxial magnetic films by a procedure that does not introduce variations in the magnetic properties (principally anisotropy field) at the edges of the isolated regions. A completely different mechanism is operable for the domain behavior in these isolated magnetic regions from that of the equilibrium energy domain mechanism. Here, the quantity that determines whether the area stays a single domain, or forms multiple domains after a saturating field is removed, is the value of $H_k - 4\pi M_s$. Here again $H_k$ is the anisotropy field and $4\pi M_s$ is the demagnetization field of an area far greater in extent than in thickness. A comparison of the value of $H_k - 4\pi M_s$ to the saturation field $H_s$ determines which of three stability regimes will be obtained for the uniaxial material. These regimes are illustrated in the Figures.

FIG. 1 shows the magnetization curve for the case where $H_k - 4\pi M_s$ is negative or $H_k - 4\pi Ms < O$. Upon saturation of the magnetic film the area will stay a single domain only above the range of applied fields where $H_{app} > H_k - 4\pi M_s$. With no bias field multiple domains result. This condition is, therefore, unstable in a zero applied field.

Consider the other two conditions: $H_k - 4\pi M_s < H_s$ (FIG. 2) and $H_k - 4\pi M_s > H_s$ (FIG. 3). Consider the application of a reversal field commencing with the saturated state. The applied field at which the first magnetization rotation occurs is $H_{app} = H_k - 4\pi Ms$. If $H_{app}$ is less than $H_s$ then the reversal field will cause multiple domains to be formed which will not be saturated with the applied field. As the applied field is removed, an equilibrium multiple domain structure will result. This is shown in FIG. 2. However, if once saturated, no reversal field is applied the area will remain a single domain. This is a metastable condition.

If the field required for reversal, $H_{app}$ is more than $H_s$ (FIG. 3), then a saturated area will result from each switching reversal. The area can only exist in a single domain state when fields parallel and antiparallel to the easy direction area applied. This result is shown in FIG. 3. Clearly, again the conditions $H_k - 4\pi M_s > H_s$ is the preferred set of conditions for large stable single domain areas.

This approach to creating large area stable domains provides much greater freedom of choice in material property selection. The magnetization ($4\pi M_s$) is free to be any value within the constraints set forth as shown in FIG. 3. Since $M_s$ is a factor in the derived quantity, $H_k$, the value of $M_s$ can be used to adjust $H_k$ as well.

The large area single domains can be switched between two states by the application of an external field. These dual states include magnetization in two directions, up or down, normal to the plane of the epitaxial layer. The field can be derived from any means such as a current carrying conductor loop, coincident fields formed by cross conductors, or the concentration of a charge upon an auxiliary element such as a permalloy element.

What is meant by a large area in one embodiment of the present invention is a large area stable domain having a diameter of 3.5 centimeters. When it is realized that the equilibrium energy domain size of the particular material selected was 5 microns, one understands that the large area being switched in a bistable position is 7,000 times larger than the dimension of equilibrium energy domain size. In another embodiment, a spiral pattern of magnetic material meeting the method of the present invention was placed upon a non-magnetic substrate. This spiral shape was also switched from one stable state to another. The sprial being 40 centimeters long and 2 milimeters wide was 200,000 times longer and 400 times wider than the size of the equilibrium energy domain. Thus, it is clear that the shape of the large area is not a factor in creating stable domains if the method of the present invention is followed.

One factor which is important is that the material be uniform through its bulk including its edges. To accomplish this, the edge of the material must be etched to remove stress anomalies associated with the creation of the isolated area.

The material which may be used to practice the present invention is of little importance. First, the material must be magnetic. Second, the material must meet the requirements that its saturation field ($H_s$) is less than its anisotropy field ($H_k$) reduced by the value of a demagnetization factor ($4\pi$) times the magnetization value ($M_s$).

The materials showing this phenomenon can be any which can be fashioned to show a uniaxial anisotropy. The preferred magnetic materials are the garnets having the general formula $A_3B_5O_{12}$ where the "A" constituent of the film formation has at least one element selected from the group: cerium, praseodymium, neodymium, promethium, samarium, europium, gadolinium, bismuth, terbium, dysprosium, holmium, erbium, thallium, ytterbium, lutetium, lanthanum; and yttrium; the "B" constituent of the film formulation is taken from the group: iron, iron and aluminum, iron and gallium, iron and germanium, iron and indium, iron and scandium, iron and titanium, iron and vanadium, iron and chromium, iron and manganese, and suitable mixtures from within the group. It has been found that adjustment of the "A" constituents will adjust the value of the anisotropy energy constant ($K_u$) which, in turn, adjusts the anisotropy field ($H_k$), while adjustment of the "B" constituents will adjust the magnetization value ($M_s$).

The substrate material is preferably a single crystal garnet having the general formula $A_3B_5O_{12}$ when the "A" constituent of the single crystal substrate formulation is at least one element selected from the group: of cerium, praseodymium, neodymium, promethium, samarium, europium, gadolinium, terbium, dysprosium, holmium, erbium, thallium, zirconium, ytterbium, lutetium, lanthanum, yttrium, calcium, and bismuth and the "B" constituent of the wafer formulation is at least one element from the group: indium, gallium, scandium, titanium, vanadium, chromium, manganese, rhodium, zirconium, hafnium, niobium, tantalum, aluminum, phosphorus, arsenic and antimony.

Other compounds such as the spinel ferrites, the orthoferrites and the hexagonal ferrites, will also serve the purpose of this invention. Further, metallic material such as the rare earths and ferrous materials may also be used.

The key to the present invention over the prior art is that the large area stable domains created by the method of the present invention remain stable in the absence of a biasing magnet and without the use of compensation temperature material. Many prior art devices have depended on temperature factors and taught that demagnetization effects can be neglected. In the present invention, the demagnetization term ($4\pi M_s$) is not a term that can be neglected. In fact, it is a critical factor that must be controlled.

The method described by the present invention is capable of producing a large area stable domain solely through the application of field currents. This switching is accomplished by meeting the requirement:

$$H_{app} > H_k - 4\pi M_s > H_s$$

The method of the present invention produces large area stable domains which may be magnetically switched independent of the equilibrium energy domain size. Stability within the present invention is controlled by the anisotropy value of the material rather than by temperature compensation or a biasing magnetic field as in the prior art.

While the method of present invention has been described in associations with a single crystal magnetic material placed as an epitaxial film upon a non-magnetic single crystal substrate, it should be understood that several single crystal materials may be utilized including synthetic garnets, hexagonal ferrite crystals, orthoferrites and spinel ferrites. Further, metals may be used such as rare earths, ferrous metals and cobalt. The material produced by the method of the present invention may be utilized in various devices including magneto-optic devices, computer memory elements, logic devices, and microwave devices. Accordingly, the present invention should be limited only by the appended claims.

We claim:

1. A method to select magnetic film material that exhibits magnetically bistable regime characteristics for single magnetic domains in the absence of a bias magnetic field characterized by the steps of (a) establishing the value of a saturation field ($H_s$) of the magnetic film by the steps of:

(1) exposing the film to a variable magnetic field to develop a plurality of magnetic domains, (2) increasing the strength of the magnetic field, and (3) sensing the reversal of magnetic polarity of a last one of said plurality of magnetic domains which coincides with the complete magnetic reversal of the film which is determinative of the value of the saturation field ($H_s$);

(b) establishing the value of magnetization ($M_s$) of the film by sensing an induced voltage generated by the change in magnetic flux at said complete magnetic reversal of the film;

(c) establishing the value of an anisotropy constant ($K_u$) of the film from the ration $2K_u/M_s$ which is determinative of the anisotropy field ($H_k$); and, (d) accepting said magnetic film material when the value of the initial saturation field ($H_s$) is less than the value of the anisotropy field ($H_k$) reduced by the value of a demagnetization factor ($4\pi$) times the magnetization value ($M_s$) of the film material so that said selected magnetic film material exhibits the desired bistable regime characteristics.

2. The method of claim 1 characterized by the additional step of etching the edge of said selected magnetic film material to remove stress anomalies associated therewith.

3. The method of claim 1 wherein the reversal of the magnetization direction is absent the utilization of temperature control.

4. The method of claim 1 wherein said selected magnetic film material is a single crystal material.

5. The method of claim 4 wherein said single crystal material may be selected from a group consisting of hexagonal ferrite crystals, synthetic garnet crystals, orthoferrites and spinel ferrite crystals.

6. The method of claim 1 wherein said selected magnetic film material is metallic.

7. The method of claim 6 wherein said metallic film material may be selected from a group consisting of rare earths or ferrous metals.

8. The method of claim 1 characterized by the additional step of magnetizing the material selected wherein the dimension of a resulting large area domain exceeds the dimension of the equilibrium energy domain.

9. A method to form a magnetic film material that exhibits large area stable magnetic domains in the absence of a bias magnetic field characterized by the steps of:

(a) mixing a presample formulation of a magnetic film material from identified elements in a molar ratio consisting of $A_3B_5O_{12}$;

(b) establishing the value of a saturation field ($H_s$) of the magnetic film material by the steps of:

(1) exposing the film to a variable magnetic field to develop a plurality of magnetic domains, (2) increasing the strength of the magnetic field, and (3) sensing the reversal of magnetic polarity of a last one of said plurality of magnetic domains which coincides with the complete magnetic reversal of the film which is determinative of the value of the saturation field ($H_s$);

(c) establishing the value of magnetization ($M_s$) of the film by sensing an induced voltage generated by the change in magnetic flux at said complete magnetic reversal of the film;

(d) establishing the value of an anisotropy energy constant ($K_u$) of the film from the ration $2K_u/M_s$ which is determinative of the anisotropy field ($H_k$); and, (e) selectively altering the molar ratio of $A_3$ of said presample formulation to adjust the established value of the anisotropy energy constant ($K_u$), and the molar ratio of $B_5$ of said presample formulation to adjust the measured value of the magnetization value ($M_s$), both as may be required so that the value of the initial saturation field ($H_s$) is less than the value of the anisotropy field ($H_k$) reduced by the value of a demagnetization factor ($4\pi$) times the magnetization value ($M_s$) of the final magnetic film material.

10. The method of claim 9 wherein altering the molar ratio $A_3$ includes adjusting the inclusion by molecular weight of at least one of the following elements which may comprise $A_3$: cerium, praseodymium, neodymium, promethium, samarium, europium, gadolinium, bismuth, terbium, dysprosium, holmium, erbium, thallium, ytterbium, lutetium, lanthanum, and yttrium; and; altering the molar ratio of $B_5$ includes adjusting the inclusion by molecular weight of at least on of the following elements which comprise $B_5$: iron, iron and aluminum, iron and gallium, iron and germanium, iron and indium, iron and scandium, iron and titanium, iron and vanadium, iron and chromium, and iron and manganese.

* * * * *